US008010869B2

(12) United States Patent  
Wehn et al.

(10) Patent No.: US 8,010,869 B2  
(45) Date of Patent: Aug. 30, 2011

(54) METHOD AND DEVICE FOR CONTROLLING THE DECODING OF A LDPC ENCODED CODEWORD, IN PARTICULAR FOR DVB-S2 LDPC ENCODED CODEWORDS

(75) Inventors: Norbert Wehn, Queidersbach (DE); Frank Kienle, Kirrweiler (DE); Torben Brack, Kaiserslautern (DE)

(73) Assignee: STMicroelectronics N.V. (NL)

( * ) Notice: Subject to any disclaimer, the term of this patent is extended or adjusted under 35 U.S.C. 154(b) by 993 days.

(21) Appl. No.: 11/911,148

(22) PCT Filed: Apr. 27, 2006

(86) PCT No.: PCT/EP2006/003942  
§ 371 (c)(1),  
(2), (4) Date: Oct. 10, 2007

(87) PCT Pub. No.: WO2006/117135  
PCT Pub. Date: Nov. 9, 2006

(65) Prior Publication Data  
US 2008/0172592 A1 Jul. 17, 2008

(30) Foreign Application Priority Data  
Apr. 29, 2005 (EP) .................................. 05009477

(51) Int. Cl.  
*H03M 13/00* (2006.01)  
(52) U.S. Cl. ........................... 714/758; 714/760  
(58) Field of Classification Search ............. 714/758, 714/760, 822  
See application file for complete search history.

(56) References Cited

U.S. PATENT DOCUMENTS

| 7,249,307 B2 * | 7/2007 | Varshney et al. | 714/758 |
| 7,653,858 B2 * | 1/2010 | Nefedov | 714/755 |
| 2003/0229843 A1 * | 12/2003 | Yu et al. | 714/794 |
| 2004/0109507 A1 | 6/2004 | Kanter et al. | 375/259 |

OTHER PUBLICATIONS

Fossorier, M.P.C.;, "Iterative reliability-based decoding of low-density parity check codes," Selected Areas in Communications, IEEE Journal on , vol. 19, No. 5, pp. 908-917, May 2001 doi: 10.1109/49.924874 URL: http://ieeexplore.ieee.org/stamp/stamp.jsp?tp=&arnumber=924874&isnumber=20006.*

Shao et al., Two Simple Stopping Criteria for Iterative Decoding, Information Theory, 1998 IEEE International Symposium on Cambridge, MA, USA, Aug. 16-21, 1998.

(Continued)

*Primary Examiner* — Cynthia Britt  
(74) *Attorney, Agent, or Firm* — Lisa K. Jorgenson; Allen, Dyer, Doppelt, Milbrath & Gilchrist, P.A.

(57) ABSTRACT

This is a method for controlling the decoding of a LDPC encoded codeword composed of several digital data, said LDPC code being represented by a bipartite graph between check nodes ($CN_1$) and variable nodes ($VN_i$). Said method comprises updating messages exchanged iteratively between variable nodes (VN1) and check nodes ($CN_1$). Said method comprises, at each iteration, calculating for each variable node a first sum ($\Lambda_n$) of all the incident messages ($\lambda_i$) received by said variable node and the corresponding digital data ($\lambda_{ch}$) and calculating a second sum ($VNR_{new}$) of all the absolute values of the first sums ($\Lambda_n$), and stopping the decoding process if the second sum ($VNR_{new}$) is unchanged or decreases within two successive iterations and if a predetermined threshold condition is satisfied.

25 Claims, 8 Drawing Sheets

OTHER PUBLICATIONS

Taffin, Generalised Stopping Criterion for Iterative Decoders, Electronics Letters, IEE Stevenage, GB< vol. 39, No. 13, Jun. 26, 2003, pp. 993-994.

Blanksby et al., A 690 mW 1-Gb/s 1024-b, Rate-1/2 Low-Density Parity-Check Code Decoder, IEEE Journal of Solid State Circuits, vol. 27, No. 3, Mar. 2002.

Kienle et al., Low Complexity Stopping Criterion for LDPC Code Decoders, Vehicular Technology Conference, 2005.

Eckford, Convergence of Iterative Decoding in Channels with Memory, [Online] URL http://www.comm.toronto.edu/{eckford/pubs/ciss2005-slides.pdf> Mar. 3, 2005.

Mao et al., Codes on Graphs and Iterative Decoding: A Study Through Low-Density Parity-Check Codes [Online] URL:www.sce.carleton.ca/bcws/oldsource/softlibrary/23May00_1.ppt> Sep. 6, 2003.

* cited by examiner

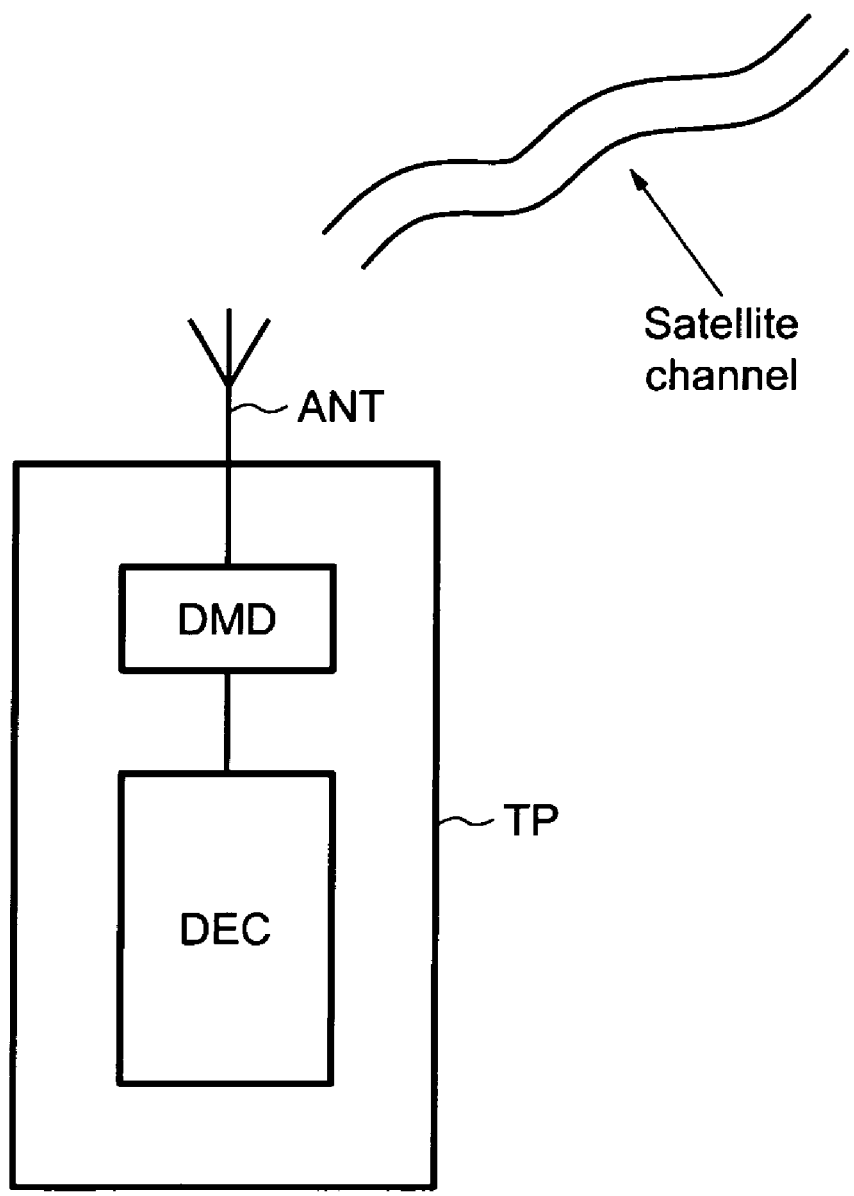

METHOD AND DEVICE FOR CONTROLLING THE DECODING OF A LDPC ENCODED CODEWORD, IN PARTICULAR FOR DVB-S2 LDPC ENCODED CODEWORDS

FIELD OF THE INVENTION

The present invention is generally directed to the field of data communication, and more specifically, to the decoding of codewords encoded with an LDPC (Low Density Parity-Check) code.

The present invention is more particularly, but not exclusively, directed to a data communication system utilizing the DVB-S2 (Digital Video Broadcast) standard.

BACKGROUND OF THE INVENTION

Low-Density Parity-Check (LDPC) codes were introduced by Gallager in 1962 and rediscovered in 1996 by MacKay and Neal. For a long time they had no practical impact due to their computational and implementation complexity. This changed with advances in microelectronics that led to more computational power available for simulation, and which now enables implementation. Due to their excellent error correction performance they are considered for future telecommunication standards.

An LDPC code is a linear block code defined by its sparse M×N parity check matrix H. It contains j ones per column and k ones per row, respectively called row and column degrees. A (j,k) regular LDPC code has row and column degrees of uniform weight, otherwise the code is irregular. A parity check code can be represented by a bipartite graph. The M check nodes correspond to the parity constraints, and the N variable nodes represent the data symbols of the codeword. An edge in the graph corresponds to a one in the parity check matrix.

In the LDPC code encoder the packet to encode of size (N−M) is multiplied with a generator matrix G of size (N−M)×N. This multiplication leads to an encoded vector of length N. The generator matrix G and the parity check matrix H satisfy the relation $GH^t=0$, where 0 is the null matrix.

Generally speaking, an LDPC code decoder comprises a decoding module which receives the encoded vector of length N, and delivers an intermediate vector of length N by using the parity check matrix H. Then a demapping module extracts from the intermediate vector the decoded vector of length (N−M).

More precisely, LDPC codes can be decoded using message passing algorithms, either in hard or soft decision form. The decoding is then an iterative process, which exchanges messages between variable and check nodes. Typically, a Belief Propagation (BP) algorithm is used, which exchanges soft-information iteratively between variable and check nodes. The code performance mainly depends on the randomness of the parity check matrix H, the codeword size N and the code rate $R=(N-M)/N$.

The channel coding part is a very important component in wireless communication systems, like UMTS, WLAN and WPAN. Especially in the domain of WLAN and WPAN, the latency of the decoding is of critical importance. Low Density Parity Check codes can be seen as a promising candidate for these kinds of systems in the near future. These codes are being deployed in the DVB-S2 standard, and in some optical fiber communication systems. More applications will follow in the near future.

The codes have some very interesting properties, which make them a natural choice for latency critical applications.

The new DVB-S2 standard features a powerful forward error correction FEC system, which enables transmission close to the theoretical limit. That is, enabled by using LDPC codes which can even out perform Turbo-Codes. To provide flexibility, 11 different code rates R ranging from $R=\frac{1}{4}$ up to $R=\frac{9}{10}$ are specified with a codeword length up to 64800 bits. This huge maximum codeword length is the reason for outstanding communication performance. The codeword length of 64800 bits will now be described.

For the DVB-S2 code, 64800 variable nodes (VN) and $64800\times(1-R)$ check nodes (CN) exist. The connectivity of these two types of nodes is specified in the standard. The variable nodes comprise information nodes and parity nodes. For decoding the LDPC code, messages are exchanged iteratively between these two types of nodes, while the node processing is of low complexity. Generally, within one iteration, the variable nodes (VN) are first processed, then the check nodes (CN).

The decoding of LDPC codes is an iterative process, for example, for the DVB-S2 standard up to 40 iterations are required to gain the desired communication performance. Standard LDPC code decoder implementations assume a fixed number of iterations. In "A 690-mW 1-Gb/s, Rate-½ Low-Density Parity-Check Code decoder" by A. J. Blanksby and C. J. Howland, published in the IEEE Journal of Solid-State Circuits, vol. 37, no. 3, pp. 404-412 and March 2002, 64 decoding iterations are performed.

For decodable blocks or codewords, the stopping criteria taking into account the check node sum of the log-likelihood ratios of the incident edges is a very good stopping criteria, but for undecodable blocks or codewords, the full number of iterations is processed so a lot of energy and processing time is wasted.

SUMMARY OF THE INVENTION

In view of the foregoing background, an object of the present invention is to stop the decoding in an early stage of the decoding process for undecodable codewords.

This and other objects, advantages and features in accordance with the present invention are provided by a method for controlling the decoding of an LDPC encoded codeword composed of digital data. Each data may be also called a "soft bit" which is a real value coded on several bits and corresponding to the value of the corresponding bit of the transmitted codeword actually received from the channel. The LDPC code may be represented by a bipartite graph between check nodes and variable nodes.

The method may comprise updating messages exchanged iteratively between variable nodes and check nodes. The method may comprise, at each iteration, calculating for each variable node a first sum of all the incident messages received by the variable node and the corresponding digital data, and calculating a second sum of all the absolute values of the first sums. The decoding process is stopped if the second sum is unchanged or decreases within two successive iterations, and if a predetermined threshold condition is satisfied.

However, if the threshold condition is not satisfied, the decoding process is not stopped even if the second sum is unchanged or decreases within two successive iterations. Such a controlled decoding permits the decoding of an undecodable codeword to be stopped early in the decoding process. A lot of energy and processing time wasted during attempts of undecodable codewords decoding is avoided.

The predetermined threshold condition may be satisfied if a current second sum is smaller than a predetermined threshold. The unchanging or decreasing of the second sum indicates that the codeword is undecodable preferably at the beginning of the decoding process.

When the second sum passes the threshold, a decreasing of the second sum may occur even if the codeword is actually decodable. Accordingly, the stopping criteria has to be switched off when the current second sum passes the threshold. The threshold is advantageously dependent on the code rate of the LDPC code. It may be determined only once for each code rate. Moreover, the encoded codeword is received from a channel, and the threshold is advantageously independent on the signal to noise ratio of the channel. Furthermore, the threshold may be dependent on the number of bits of the exchanged messages. For example, the encoded codeword is received from a channel, and the threshold $VNR_{off}$ is defined by:

$$VNR_{off} = \frac{4}{R} \times \left(\frac{E_b}{N_0}\right)_{WR} \times N$$

wherein:

N is the number of bits of the exchanged messages, $E_b$ is the mean energy for transmitting a bit information on the channel, $N_0$ is the noise energy of the channel, R is the code rate of the LDPC code, and $$\left(\frac{E_b}{N_0}\right)_{WR}$$

is the value of the ratio $$\frac{E_b}{N_0}$$

at a waterfall region of a curve representing the frame error rate (FER) as a function of the ratio.

The threshold $VNR_{off}$ can be also defined for example with the relation: $VNR_{off} = 2^{(q-1)} \times N$ wherein:

n is the number of bits of the exchanged messages, and q is the number of bits used for representing the absolute value of the message.

According to another embodiment, the predetermined threshold condition may be satisfied as long as the number of iterations is smaller than or equal to a predetermined number of iterations. Even for decodable codewords, a drop of the second sum can occur between the $20^{th}$ and the $30^{th}$ iteration. Accordingly, the stopping criteria can be switched off after, for example, a number of iterations comprised between 5 and 15.

In a preferred embodiment, the digital data of the codeword and the messages may be log-likelihood ratios (LLRs). The LDPC code is, for example, a DVB-S2 LDPC code.

According to another aspect of the invention, a decoder for decoding an LDPC encoded codeword composed of digital data is provided. The LDPC code may be represented by a bipartite graph between check nodes and variable nodes. The decoder may comprise processing means or a processor to update messages exchanged iteratively between variable nodes and check nodes. The processing means may comprise calculating means or a calculator for calculating, at each iteration for each variable node, a first sum of all the incident messages received by the variable node and the corresponding digital data, and calculating a second sum of all the absolute values of the first sums. The processing means also comprise control means or a controller for stopping the decoding process if the second sum is unchanged or decreases within two successive iterations and if a predetermined threshold condition is satisfied.

The predetermined threshold condition may be satisfied if a current second sum is smaller than a predetermined threshold. The threshold is advantageously dependent on the code rate of the LDPC code.

Advantageously, the decoder may comprise memory means or a memory. The memory may comprise a look-up table storing values of the threshold according to the code rate of the LDPC code and the number of bits of the exchanged messages.

According to another aspect of the invention, an element of a wireless communication system including a decoder as above described is provided. This element can be a terminal or a base station, or an access point device.

According to another aspect of the invention, a wireline communication system, for example an XDSL system, a fiber optic system, or a power line system comprising a decoder as above described is provided.

BRIEF DESCRIPTION OF THE DRAWINGS

Other advantages and features of the invention will appear on examining the detailed description of different embodiments, these being in no way limiting, and of the appended drawings in which:

FIG. 8 illustrates a block diagram of a terminal of a wireless communication system according to the present invention.

DETAILED DESCRIPTION OF THE PREFERRED EMBODIMENTS

In the following description, the LDPC code is a DVB-S2 LDPC code as defined in "ETSI EN 302 307 v1.1.1 (2004-06)" defining the DVB-S2 standard, although the invention is not limited to such a code. The parity check matrix H of LDPC code is a sparse binary matrix. The set of valid codewords x have to satisfy: $H^t x = 0$ A column in H is associated to a bit of the codeword and a row corresponds to a parity check. A nonzero element in a row of H means that the corresponding bit contributes to this parity check. The code can best be described by a bipartite graph called a Tanner graph (FIG. 1), which is a graphical representation of the associations between code bits and parity checks. Code bits are shown as variable nodes $VN_i$ (circles), and parity checks as check nodes $CN_i$ (squares), with edges connecting them. The number of edges on each node is called the node degree. If the node degree is identical for all variable nodes, the parity check matrix H is called regular, otherwise the parity check matrix is called irregular. The degree distribution gives the fraction of nodes having a certain degree.

Figure 1:
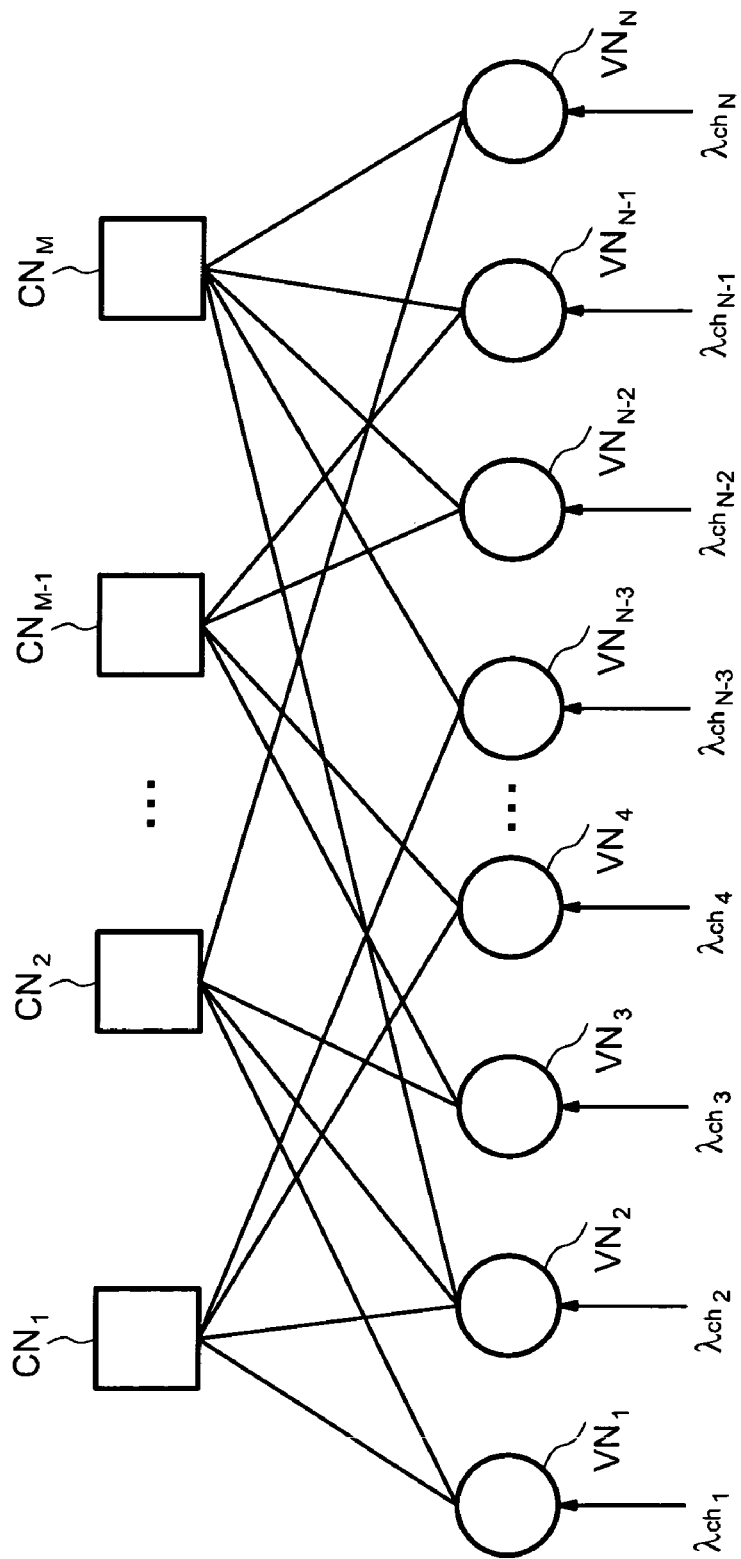
FIG. 1 illustrates a bipartite graph of a LDPC code according to the present invention.

The Tanner graph of a DVB-S2 code is illustrated in FIG. 1, with N variable nodes $VN_i$ (i=1 to N) and M check nodes $CN_i$ (i=1 to M). LDPC codes can be decoded using a message passing algorithm. It exchanges soft-information iteratively between the variable nodes and check nodes. The code performance mainly depends on the randomness of the graph, the codeword size, and the code rate R.

The exchanged soft-information are generally log-likelihood ratios (LLR). The update of the messages at the variable nodes $VN_i$ can be effected in two steps.

In a first step, each variable node calculates a current estimate $\Lambda_n$ of the decoded bit corresponding to the variable node according to the relation:

$$\Lambda_n = \lambda_{ch} + \Sigma \lambda_k \qquad (1)$$

wherein $\Lambda_n$ is the current estimate of the decoded bit corresponding to the variable node, $\lambda_{ch}$ is the corresponding channel LLR of the variable node (corresponding to a digital data of the encoded codeword to be decoded), and $\lambda_k$ is the LLRs of the incident edges of the variable node.

In other words, $\Lambda_n$ is a first sum of all the incident messages $\lambda_k$ received by the variable node and the corresponding digital data $\lambda_{ch}$. The sign of $\Lambda_n$ represents the hard decision of the decoded bit (one or zero), and the magnitude of $\Lambda_n$ represents the confidence of the decoding of the bit.

In a second step, an update of the outgoing message i is calculated, with the update being the LLR sum $\Lambda_n$ of the corresponding variable node minus the input message LLR, according to the relation:

$$\lambda_i^{new} = \Lambda_n - \lambda_i^{old} \qquad (2)$$

wherein $\lambda_i^{new}$ is the updated LLR of the outgoing message i, and $\lambda_i^{old}$ is the value of the LLR of the outgoing message i before the updating.

The check node message updates are generally calculated according to the relation, for a message k comprising a LLR $\lambda_k$:

$$\tanh(\lambda_k/2) = \prod_{l=0, l \neq k}^{i-1} \tanh(\lambda_l/2) \qquad (3)$$

wherein $\lambda_k$ is the LLR updated from the check node, and $\lambda_l$ is the LLRs of the incident edges of the check node.

In the following description, the early detection of undecodable codewords will be detailed. Usually, digital data of encoded codewords represent log-likelihood ratios (LLRs). The detection permits the decoding process to be stopped in an early stage for an undecodable codeword.

A second sum VNR, also called a "variable node reliability", is calculated at each iteration of the decoding process. The second sum VNR is the sum of all the absolute values of the first sums $\Lambda_n$ of the variable nodes:

$$VNR = \Sigma |\Lambda_n| \qquad (4)$$

This value VNR is easily obtained.

Figure 2:
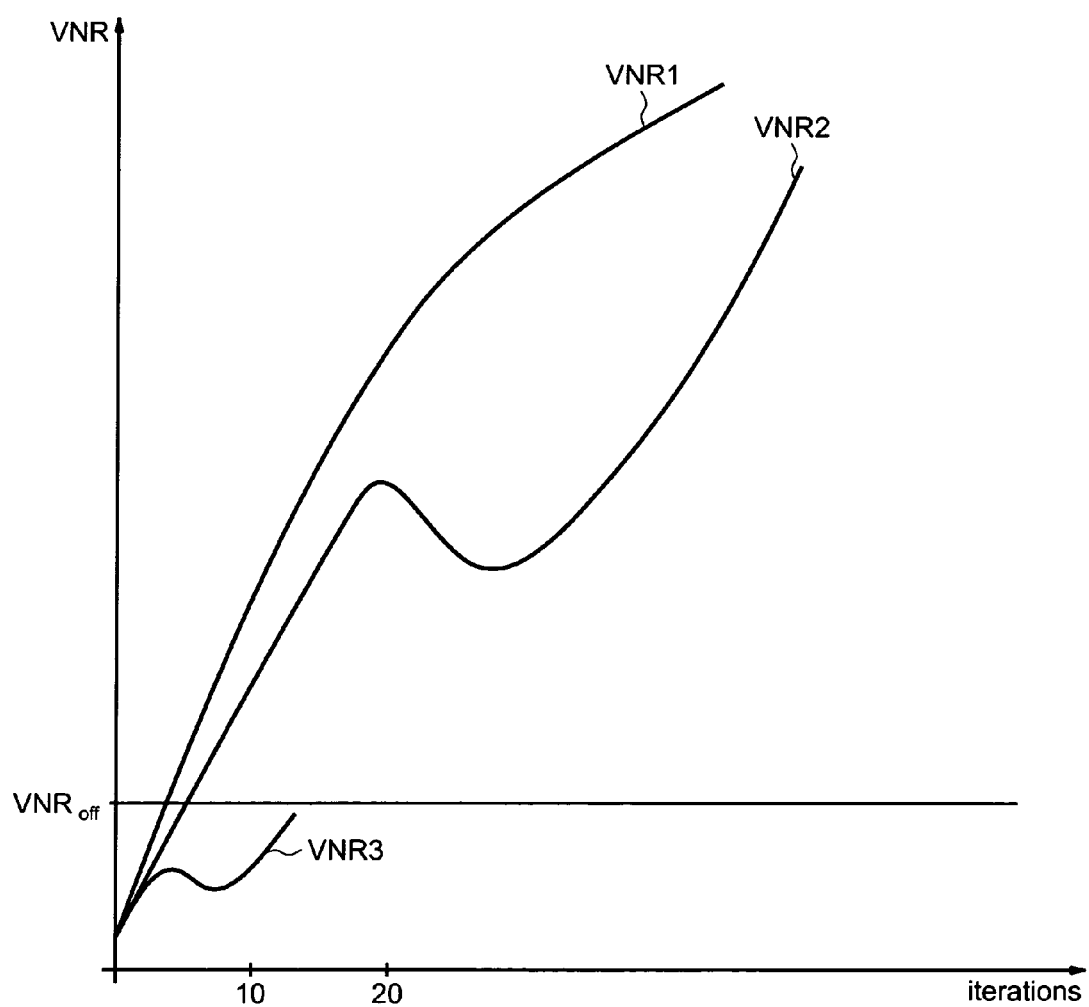
FIG. 2 illustrates examples of variation of variable node reliability for decodable and undecodable codewords according to the present invention.

For an infinite block size a monotonic increasing of VNR versus the number of iterations is expected for a decodable codeword, as represented by curve VNR1 on FIG. 2. However, when blocks of finite length are decoded, uncorrelated LLRs cannot be guaranteed. This is the reason why a VNR drop can be seen on the curve VNR2 of FIG. 2 between the $20^{th}$ and the $25^{th}$ iteration, even though the corresponding block can be decoded.

Thus, the decoding process is stopped if the VNR does not change or decreases within two successive decoding iterations, as illustrated by curve VNR3 of FIG. 2 (corresponding to an undecodable codeword). But this stopping criteria has to be switched off when the VNR passes a threshold $VNR_{off}$. In such a case, the decoding process will be stopped by using conventional stopping criteria, since it is assumed that the codeword is actually decodable.

Figure 3:
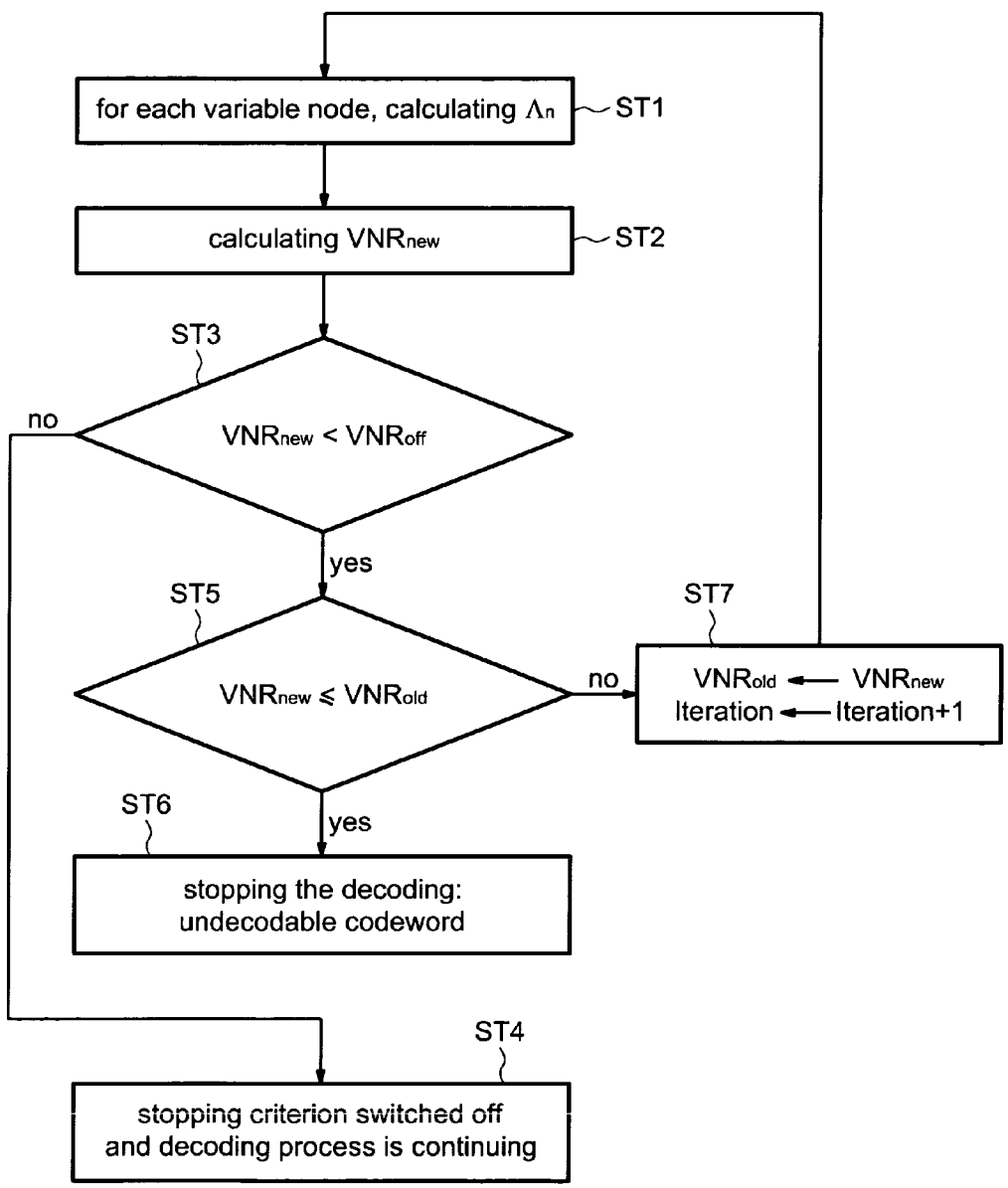
FIG. 3 is a flowchart of a first embodiment of the method according to the present invention.

In FIG. 3 a first flowchart of the detection of an undecodable codeword is illustrated. For a current iteration of the decoding process, a first sum $\Lambda_n$ is calculated with equation (1) for all the variable nodes (step ST1). Then, a second sum or variable node reliability $VNR_{new}$ is calculated with equation (4) (step ST2).

Thus, a test (step ST3) is effected. If the current value $VNR_{new}$ of the second sum is inferior to a predetermined threshold $VNR_{off}$, then the stopping criteria is stopped and the decoding process is continued (step ST4). Otherwise, if the current value $VNR_{new}$ of the second sum is greater or equal to the predetermined threshold $VNR_{off}$ another test is effected (step ST5) in comparing the current value $VNR_{new}$ with the old value $VNR_{old}$ of the second sum corresponding to the preceding iteration.

Figure 4:
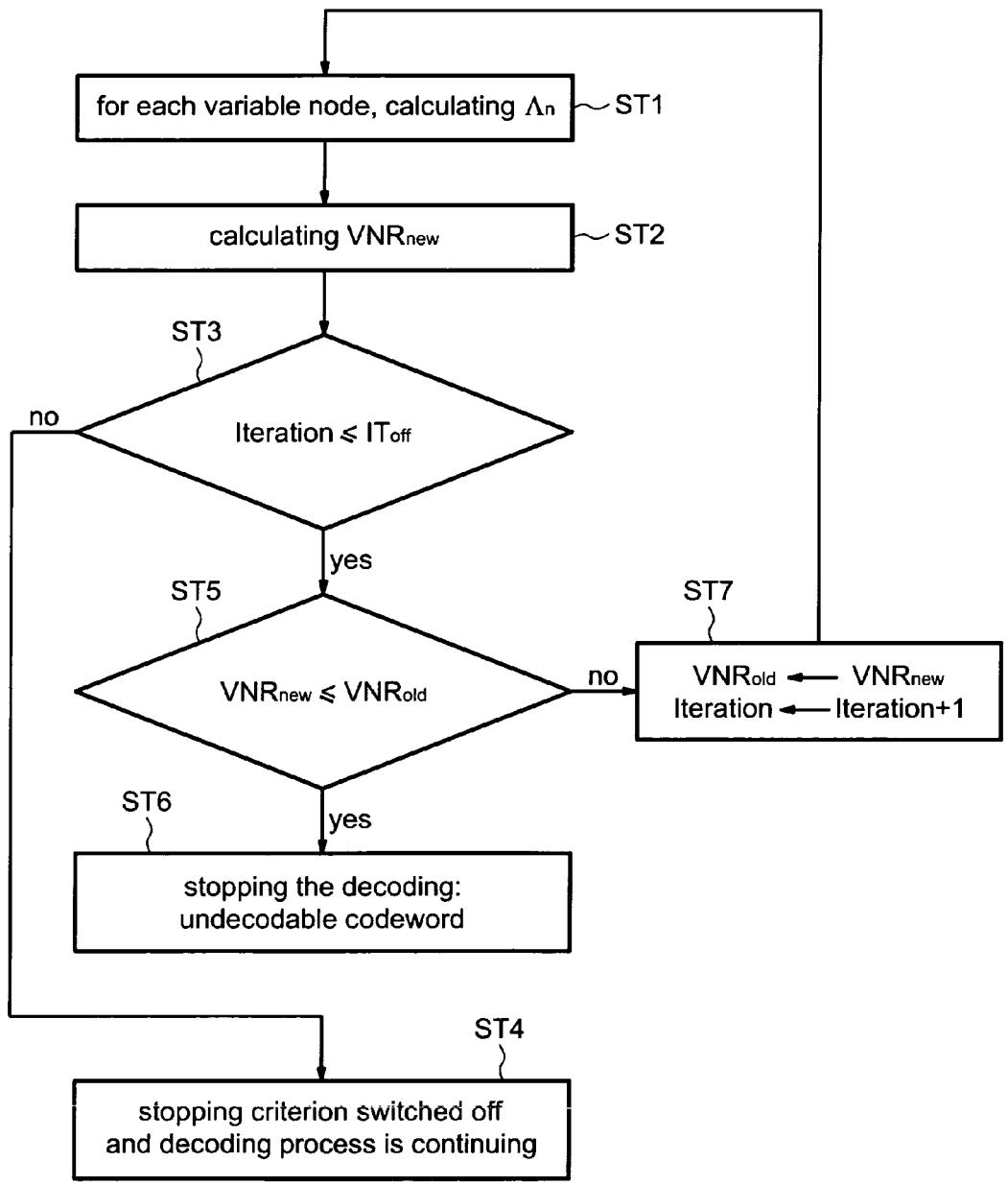
FIG. 4 is a flowchart of a second embodiment of the method according to the present invention.

If the current value $VNR_{new}$ of the second sum is inferior or equal to the old value $VNR_{old}$ of the second sum corresponding to the preceding iteration, then the decoding process is stopped (step ST6). Otherwise, the current value $VNR_{new}$ is affected to the old value $VNR_{old}$ (step ST7) for the next iteration of the decoding process. For the first iteration, a weak value, for example zero, can be affected to the old value $VNR_{old}$. FIG. 4 illustrates another flowchart of another embodiment of the detection of an undecodable codeword. In this example, the test (step ST3) is different but equivalent to the test of the FIG. 3. The condition on the current value $VNR_{new}$ inferior to the threshold $VNR_{off}$ is replaced with a condition on the current number of iterations: iteration inferior or equal to a threshold number of iterations $IT_{off}$. $IT_{off}$ is, for example, comprised between 5 and 15.

In other words, if the number of iterations is greater than $IT_{off}$, the stopping criteria is switched off and the decoding process is continuing. For a codeword received from a channel, the threshold $VNR_{off}$ is independent on the signal to noise ratio of the channel. Nevertheless, the threshold $VNR_{off}$ is dependent on the code rate R of the LDPC code and on the number of bits N of the exchanged messages.

Figure 5:
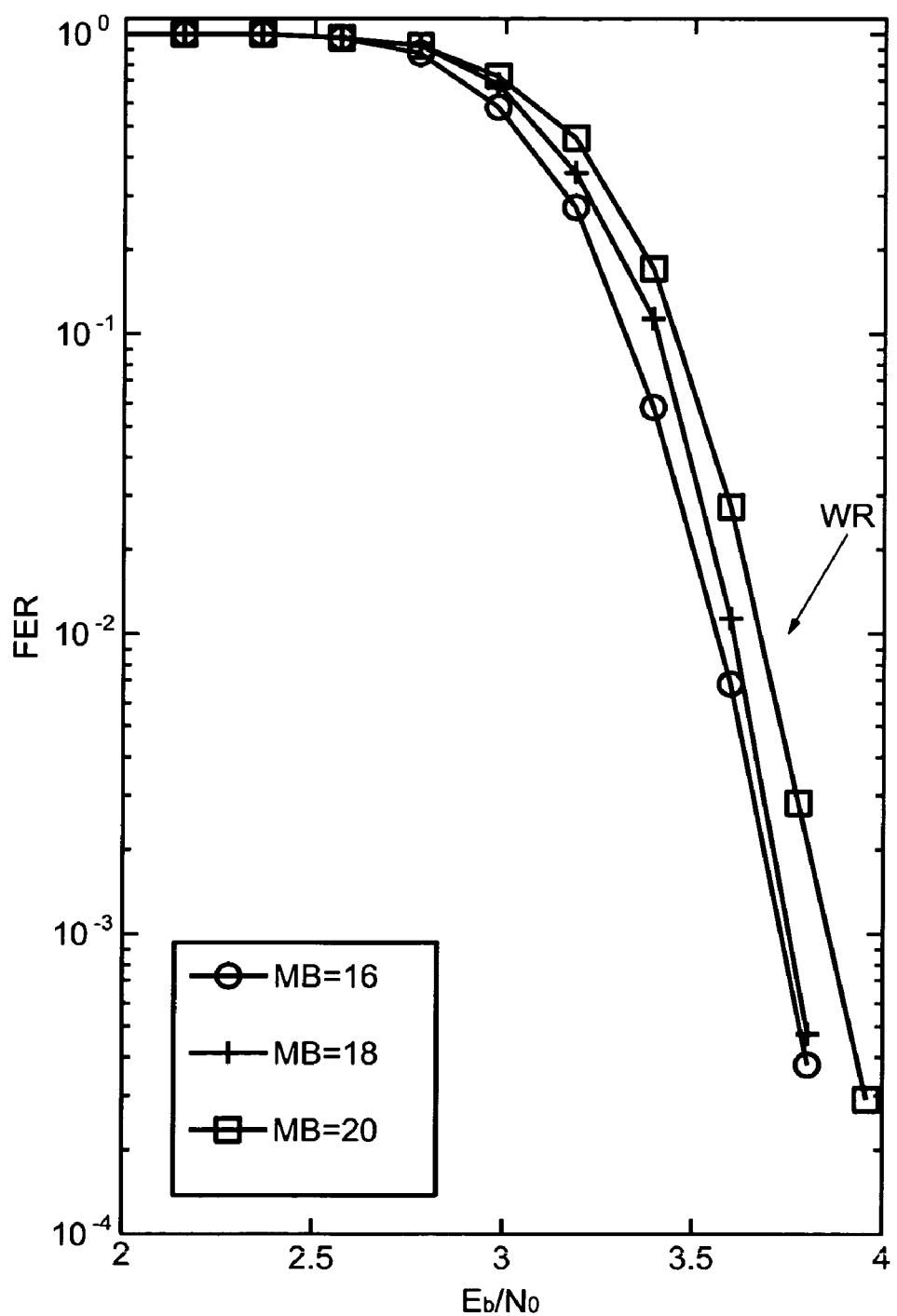
FIGS. 5 and 6 illustrate communication performances curves for stopping criteria according to the present invention.
Figure 6:
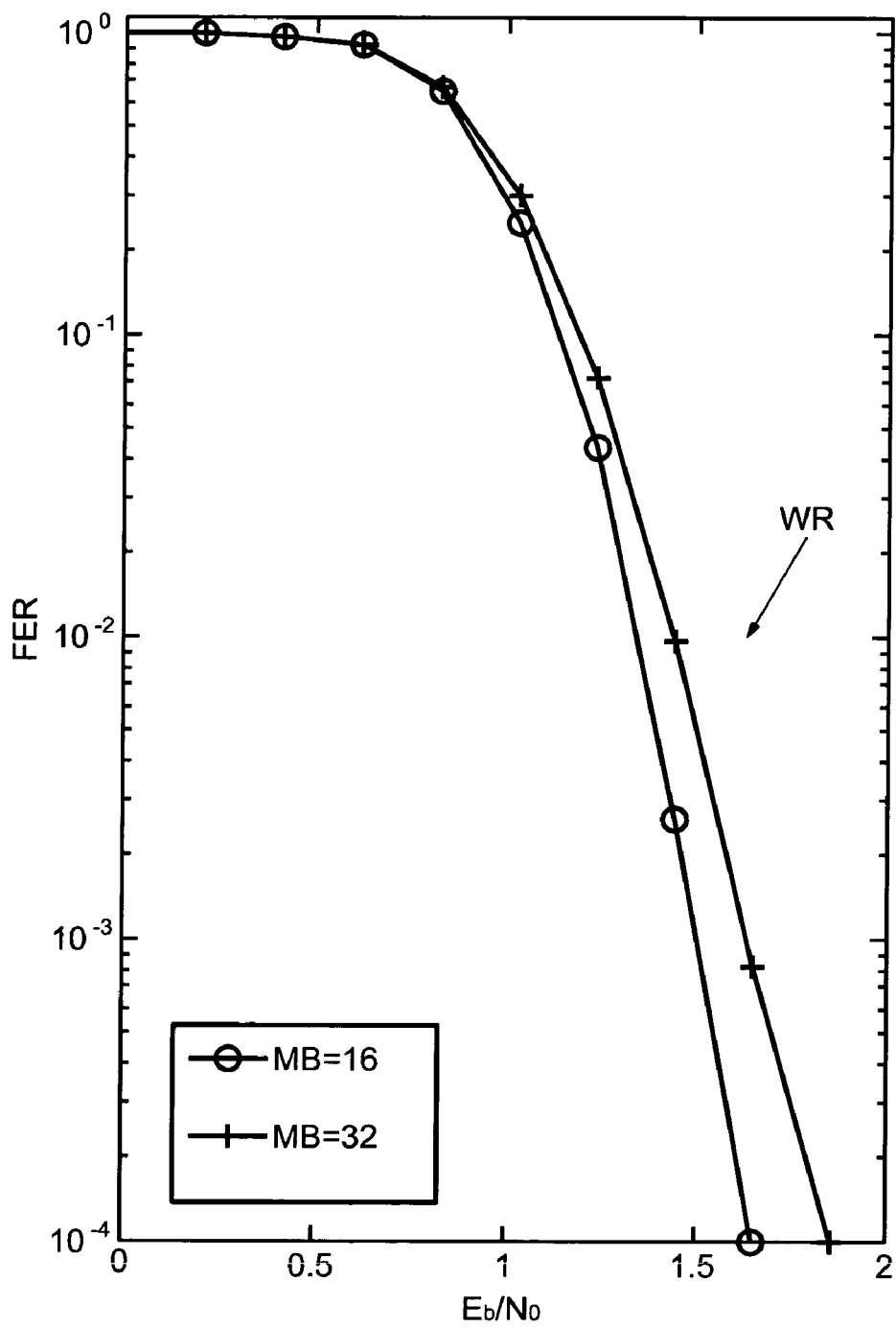

More precisely, the threshold $VNR_{off}$ can be calculated only once for each code rate with the relation:

$$VNR_{off} = \frac{4}{R} \times \left(\frac{E_b}{N_0}\right)_{WR} \times N \qquad (5)$$

wherein:

N is the number of bits of the exchanged messages, $E_b$ is the mean energy for transmitting a bit information on the channel, $N_0$ is the noise energy of the channel, R is the code rate of the LDPC code, and $$\left(\frac{E_b}{N_0}\right)_{WR}$$

is the value of the ratio $$\frac{E_b}{N_0}$$

of a waterfall region of a curve representing the frame error rate (FER) as a function of the ratio. The waterfall region WR corresponds to the region of great decreasing of the curves, examples of which are illustrated in FIGS. 5 and 6. More precisely, FIG. 5 shows the frame error rate FER as a function of the signal to noise ratio $$\frac{E_b}{N_0}$$

for different values of a mean bound MB which can roughly set t a SNR (signal to noise ratio) point around the waterfall region WR. Further these curves have been obtained for a code rate R=0.8, a codeword of 2000 bits and a 6 bit message quantization. The most significant represents the sign and the 5 other bits represent the absolute value of the message.

Similar curves obtained for a code rate R=0.5, a codeword of 3200 bits and a 6 bit message quantization (the fractional part is equal here to 4) are illustrated in FIG. 6. Thus, for a code rate R=0.8, $$\left(\frac{E_b}{N_0}\right)_{WR}$$

is set to 3.5, whereas it is set to 1.5 for a code rate R=0.5. These curves $$FER = f\left(\frac{E_b}{N_0}\right)$$

are obtained by simulation, as for example described in the standard communication book "Digital Communications" by J. G. Proakis (McGraw-Hill), 2001, 4$^{th}$ edition.

The threshold $VNR_{off}$ can also be calculated, in various ways, only once for each code rate with the relation:

$$VNR_{off} = 2^{(q-1)} \times N$$

wherein

Figure 7:
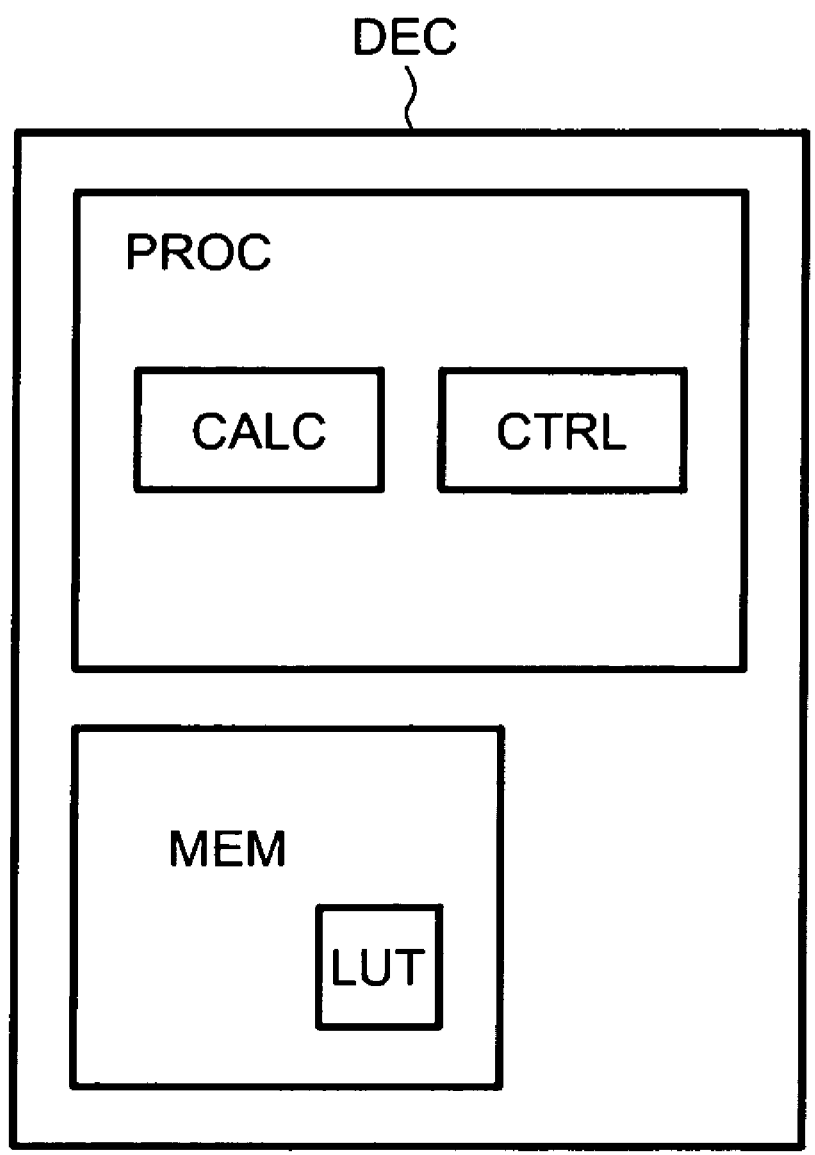
FIG. 7 illustrates a block diagram of an embodiment of a decoder according to the present invention.

N is the number of bits of the exchanged messages, and q is the number of bits used for representing the absolute value of the message. An embodiment of a decoder DEC is illustrated in FIG. 7. The decoder DEC comprises a processing module PROC, for example a software module or an ASIC.

The processing module PROC comprises a calculating module CALC for calculating, at each iteration for each variable node, the first sum $\Lambda_n$ of all the incident messages $\lambda_i$ received by the variable node and the corresponding digital data $\lambda_{ch}$, and for calculating the second sum or variable node reliability VNR of all the absolute values of the first sums $\Lambda_n$.

The processing module PROC also comprises a control module CTRL for stopping the decoding process if the second sum VNR is unchanged or decreases within two successive iterations, and if a predetermined threshold condition is satisfied.

The control module CTRL can be adapted to detect a satisfied threshold condition if a current second sum $VNR_{new}$ is smaller than a predetermined threshold $VNR_{off}$ (FIG. 3), or can be adapted to detect a satisfied threshold condition as long as the number of iterations Iteration is smaller than or equal to a predetermined number of iterations $IT_{off}$.

Moreover, the decoder DEC comprises a memory module MEM which comprises a look-up table LUT for storing values of the threshold $VNR_{off}$ according to the code rate R of the LDPC code and the number of bits N of the exchanged messages. The decoder DEC may be incorporated in a receiver TP (FIG. 8) of a wireless communication system, for example a DVB-S2 receiver receiving encoded codewords through a satellite channel, and comprising other conventional components such as a demodulator DMD.

The invention claimed is:

1. A method for controlling decoding of a low density parity-check (LDPC) encoded codeword comprising digital data, an LDPC code being represented by a graph between check nodes and variable nodes, the method comprising:
   updating messages exchanged iteratively between the variable nodes and the check nodes; and
   at each iteration performing at least
      calculating for each variable node a first sum of incident messages received by the variable node and the corresponding digital data,
      calculating a second sum of absolute values of the first sums, and
      stopping the decoding process if the second sum is unchanged or decreases within two successive iterations, and if a threshold condition is satisfied.

2. The method according to claim 1, wherein the threshold condition is satisfied if a current second sum is less than a threshold.

3. The method according to claim 2, wherein the threshold is dependent on a code rate of the LDPC code.

4. The method according to claim 2, wherein the encoded codeword is received from a channel, and the threshold is independent of a signal-to-noise ratio of the channel.

5. The method according to claim 2, wherein the threshold is dependent on a number of bits of the exchanged messages.

6. The method according to claim 2, wherein the encoded codeword is received from a channel, and the threshold is defined by:

$$VNR_{off} = \frac{4}{R} \times \left(\frac{E_b}{N_0}\right)_{WR} \times N$$

wherein:

N is a number of bits of the exchanged messages, $E_b$ is a mean energy for transmitting a bit information on the channel, $N_0$ is a noise energy of the channel, R is a code rate of the LDPC code, and $$\left(\frac{E_b}{N_0}\right)_{WR}$$

is a value of a ratio $$\frac{E_b}{N_0}$$

of a waterfall region of a curve representing a frame error rate (FER) as a function of the ratio.

7. The method according to claim 2, wherein the threshold ($VNR_{off}$) is defined by: $VNR_{off}=2^{(q-1)} \times N$
wherein:
N is a number of bits of the exchanged messages, and
q is a number of bits used for representing an absolute value of the message.

8. The method according to claim 1, wherein the threshold condition is satisfied as long as the number of iterations is less than or equal to a predetermined number of iterations.

9. The method according to claim 1, wherein the digital data of the encoded codeword and the messages comprise log-likelihood ratios (LLR).

10. The method according to claim 1, wherein the LDPC code comprises a DVB-S2 LDPC code.

11. A decoder for decoding a low density parity-check (LDPC) encoded codeword comprising digital data, the decoder comprising:
a processor for updating messages exchanged iteratively between variable nodes and check nodes of a graph for an LDPC code, said processor comprising
a calculation module for calculating, at each iteration for each variable node a first sum of incident messages received by the variable node and the corresponding digital data, and for calculating a second sum of absolute values of the first sums, and
a control module for stopping the decoding process if the second sum is unchanged or decreases within two successive iterations, and if a threshold condition is satisfied.

12. The decoder according to claim 11, wherein the threshold condition is satisfied if a current second sum is less than a threshold.

13. The decoder according to claim 12, wherein the threshold is dependent on a code rate of the LDPC code.

14. The decoder according to claim 12, wherein the encoded codeword is received from a channel, and the threshold is independent of a signal-to-noise ratio of the channel.

15. The decoder according to claim 12, wherein the threshold is dependent on a number of bits of the exchanged messages.

16. The decoder according to claim 12, wherein the encoded codeword is received from a channel, and the threshold ($VNR_{off}$) is defined by:

$$VNR_{off} = \frac{4}{R} \times \left(\frac{E_b}{N_0}\right)_{WR} \times N$$

wherein:
N is a number of bits of the exchanged messages,
$E_b$ is a mean energy for transmitting a bit information on the channel,
$N_0$ is a noise energy of the channel,
R is a code rate of the LDPC code, and $$\left(\frac{E_b}{N_0}\right)_{WR}$$

is a value of a ratio $$\frac{E_b}{N_0}$$

of a waterfall region of a curve representing a frame error rate (FER) as a function of the ratio.

17. The decoder according to claim 12, wherein the threshold is defined by: $VNR_{off}=2^{(q-1)} \times N$
wherein:
N is a number of bits of the exchanged messages, and
q is a number of bits used for representing an absolute value of the message.

18. The decoder according to claim 12, further comprising a memory comprising a look-up table for storing values of the threshold according to a code rate of the LDPC code and a number of bits of the exchanged messages.

19. The decoder according to claim 11, wherein the digital data of the encoded codeword and the messages comprise log-likelihood ratios (LLR).

20. A receiver comprising:
a demodulator; and
a decoder coupled to said demodulator for decoding a low density parity-check (LDPC) encoded codeword comprising digital data said decoder comprising:
a processor for updating messages exchanged iteratively between variable nodes and check nodes of a graph for an LDPC code, said processor configured for performing the following
calculating, at each iteration for each variable node a first sum of incident messages received by the variable node and the corresponding digital data, and for calculating a second sum of absolute values of the first sums, and
stopping the decoding process if the second sum is unchanged or decreases within two successive iterations, and if a threshold condition is satisfied, with the threshold condition being satisfied if a current second sum is less than a threshold.

21. The receiver according to claim 20, wherein the encoded codeword is received from a channel, and the threshold ($VNR_{off}$) is defined by:

$$VNR_{off} = \frac{4}{R} \times \left(\frac{E_b}{N_0}\right)_{WR} \times N$$

wherein:
N is a number of bits of the exchanged messages,
$E_b$ is a mean energy for transmitting a bit information on the channel,
$N_0$ is a noise energy of the channel,
R is a code rate of the LDPC code, and $$\left(\frac{E_b}{N_0}\right)_{WR}$$

is a value of a ratio $$\frac{E_b}{N_0}$$

of a waterfall region of a curve representing a frame error rate (FER) as a function of the ratio.

22. The receiver according to claim 20, wherein the threshold is defined by: $VNR_{off}=2^{(q-1)} \times N$ wherein:

N is a number of bits of the exchanged messages, and q is a number of bits used for representing an absolute value of the message.

23. The receiver according to claim 20, further comprising a memory comprising a look-up table for storing values of the threshold according to a code rate of the LDPC code and a number of bits of the exchanged messages.

24. The receiver according to claim 20, wherein the digital data of the encoded codeword and the messages comprise log-likelihood ratios (LLR).

25. The receiver according to claim 20, wherein the LDPC code comprises a DVB-S2 LDPC code.

* * * * *

UNITED STATES PATENT AND TRADEMARK OFFICE
CERTIFICATE OF CORRECTION

| | | |
|---|---|---|
| PATENT NO. | : 8,010,869 B2 | Page 1 of 1 |
| APPLICATION NO. | : 11/911148 | |
| DATED | : August 30, 2011 | |
| INVENTOR(S) | : Norbert Wehn, Frank Kienle and Torben Brack | |

It is certified that error appears in the above-identified patent and that said Letters Patent is hereby corrected as shown below:

Abstract, Line 4    Delete: "$(CN_1)$"
    Insert: --$(CN_i)$--

Abstract, Line 6    Delete: "(VN1) and check nodes $(CN_1)$"
    Insert: --$(VN_i)$ and check nodes $(CN_i)$--

Column 3, Line 24    Delete: "a bit information on"
    Insert: --a bit on--

Column 6, Line 64    Delete: "a bit information on"
    Insert: --a bit on--

Column 8, Line 8    Delete: "iterations Iteration is"
    Insert: --iterations is--

Column 8, Line 59    Delete: "a bit information on"
    Insert: --a bit on--

Column 9, Line 63    Delete: "a bit information on"
    Insert: --a bit on--

Column 10, Line 58    Delete: "a bit information on"
    Insert: --a bit on--

Signed and Sealed this
Twenty-fourth Day of July, 2012

David J. Kappos
*Director of the United States Patent and Trademark Office*